United States Patent
Kodaira et al.

(10) Patent No.: US 6,617,694 B2
(45) Date of Patent: Sep. 9, 2003

(54) SEMICONDUCTOR CHIP, SEMICONDUCTOR DEVICE, METHODS OF FABRICATING THEREOF, CIRCUIT BOARD AND ELECTRONIC DEVICE

(75) Inventors: Satoru Kodaira, Chino (JP); Takashi Kumagai, Chino (JP); Yasuhiko Tomohiro, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/948,943

(22) Filed: Sep. 7, 2001

(65) Prior Publication Data

US 2002/0041015 A1 Apr. 11, 2002

(30) Foreign Application Priority Data

Sep. 8, 2000 (JP) .......................... 2000-273030
Sep. 5, 2001 (JP) .......................... 2001-268333

(51) Int. Cl.⁷ .................. H01L 23/48; H01L 23/52; H01L 29/40; H01L 21/44; H01L 21/4763
(52) U.S. Cl. .................. 257/777; 257/778; 257/779; 257/786; 438/108; 438/109; 438/599; 438/612; 438/620; 438/669

(58) Field of Search ................. 257/777, 778, 257/779, 786; 438/108, 109, 599, 612, 620, 669, FOR 368, FOR 426

(56) References Cited

U.S. PATENT DOCUMENTS 6,326,681 B1 * 12/2001 Murakami et al. .......... 257/676
6,426,560 B1 * 7/2002 Kawamura et al. ......... 257/777

* cited by examiner

Primary Examiner—David E Graybill
(74) Attorney, Agent, or Firm—Hogan & Hartson, LLP

(57) ABSTRACT

The positions of first terminals of a first semiconductor chip have a plane symmetrical relationship with the positions of second terminals of a second semiconductor chip. First buffer circuits of the first semiconductor chip are identical with second buffer circuits of the second semiconductor chip at least in design. First and second internal circuits are identical with each other at least in design. The first and second semiconductor chips have different interconnecting lines.

30 Claims, 9 Drawing Sheets

SEMICONDUCTOR CHIP, SEMICONDUCTOR DEVICE, METHODS OF FABRICATING THEREOF, CIRCUIT BOARD AND ELECTRONIC DEVICE

Japanese Patent Application No. 2000-273030 filed Sep. 8, 2000 and Japanese Patent Application No. 2001-268333 filed Sep. 5, 2001 are hereby incorporated by reference in its entirety.

TECHNICAL FIELD

The present invention relates to a semiconductor chip, a semiconductor device, methods of fabricating thereof, a circuit board and an electronic device.

BACKGROUND

Stacked type semiconductor devices have been developed so far. For example, the structure that has two semiconductor chips adhered back to back or the structure that has two semiconductor chips mounted face down on both sides of a substrate are known. In this case, if the positions of the pads of the two semiconductor chips have a plane symmetry relationship, it is easy to take electric connection. This led to the use of two chips whose pad positions have a plane symmetry relationship, i.e., mirror chips. According to the conventional mirror chips, however, the internal circuits in the two chips also had a plane symmetry relationship. It was therefore necessary to fabricate two chips with different masks.

SUMMARY

A semiconductor device according to one aspect of the present invention comprises:

a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits; and a second semiconductor chip comprising a plurality of second terminals, a plurality of second buffer circuits for at least one of inputting and outputting, a plurality of second interconnecting lines which electrically connect the plurality of second terminals to the plurality of second buffer circuits, and a second internal circuit electrically connected to the plurality of second buffer circuits, wherein positions of the plurality of first terminals and positions of the plurality of second terminals are in plane symmetry, wherein the first internal circuit is identical with the second internal circuit at least in design, and wherein at least a part of the plurality of first interconnecting lines and at least a part of the plurality of second interconnecting lines are formed in different patterns.

A semiconductor chip according to another aspect of the present invention comprises:

a plurality of terminals;

a plurality of buffer circuits for at least one of inputting and outputting;

a plurality of interconnecting lines which electrically connect the plurality of terminals to the plurality of buffer circuits; and an internal circuit electrically connected to the plurality of buffer circuits, wherein one terminal $T_1$ in the plurality of terminals corresponds to two circuits $C_1$ and $C_2$ in the plurality of buffer circuits, and wherein the terminal $T_1$ is selectively connected to the circuit $C_1$ by a part of the plurality of interconnecting lines.

A semiconductor chip according to further aspect of the present invention comprises:

a plurality of terminals;

a plurality of buffer circuits for at least one of inputting and outputting;

a plurality of interconnecting lines which electrically connect the plurality of terminals to the plurality of buffer circuits; and an internal circuit electrically connected to the plurality of buffer circuits, wherein each of the plurality of terminals is connected to any one of the plurality of buffer circuits by a part of the plurality of interconnecting lines, and wherein the plurality of buffer circuits are arranged in a line at a central portion of the semiconductor chip.

A semiconductor device according to still another aspect of the present invention comprises a plurality of stacked semiconductor chips, wherein each of the semiconductor chips is the above described semiconductor chip.

A semiconductor device according to still further aspect of the present invention comprises a plurality of stacked semiconductor chips, wherein at least one of the semiconductor chips is the above described semiconductor chip.

A circuit board according to still further aspect of the present invention has the above described semiconductor device mounted thereon.

An electronic device according to still further aspect of the present invention comprises the above described semiconductor device.

A method of fabricating a semiconductor chip according to still further aspect of the present invention comprises forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits, wherein one terminal $T_1$ in the plurality of terminals corresponds to the two circuits $C_1$ and $C_2$ in the plurality of buffer circuits, and wherein the terminal $T_1$ is selectively connected to the circuit $C_1$ by a part of the plurality of interconnecting lines.

A method of fabricating a semiconductor chip according to yet another aspect of the present invention comprises forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits, wherein each of the plurality of terminals is connected to any one of the plurality of buffer circuits by a part of the plurality of interconnecting lines, and wherein the plurality of buffer circuits are arranged in a line at a central portion of the semiconductor chip.

A method of fabricating a semiconductor device according to yet further aspect of the present invention comprises:

fabricating a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits, and fabricating a second semiconductor chip comprising a plurality of second terminals, a plurality of second buffer circuits for at least one of inputting and outputting, second interconnecting lines which electrically connect the plurality of second terminals to the plurality of second buffer circuits, and a second internal circuit electrically connected to the plurality of second buffer circuits;

wherein the first and second internal circuits are formed at least with a same mask in design in such a way as to have a same structure in design;

wherein the plurality of first terminals and the plurality of second terminals are formed at least with a same mask in design in such a way as to be arranged symmetrically with respect to a line in a same arrangement in design; and wherein at least a part of the plurality of first interconnecting lines and at least a part of the plurality of second interconnecting lines are formed with masks of different designs.

DETAILED DESCRIPTION

Figure 1:
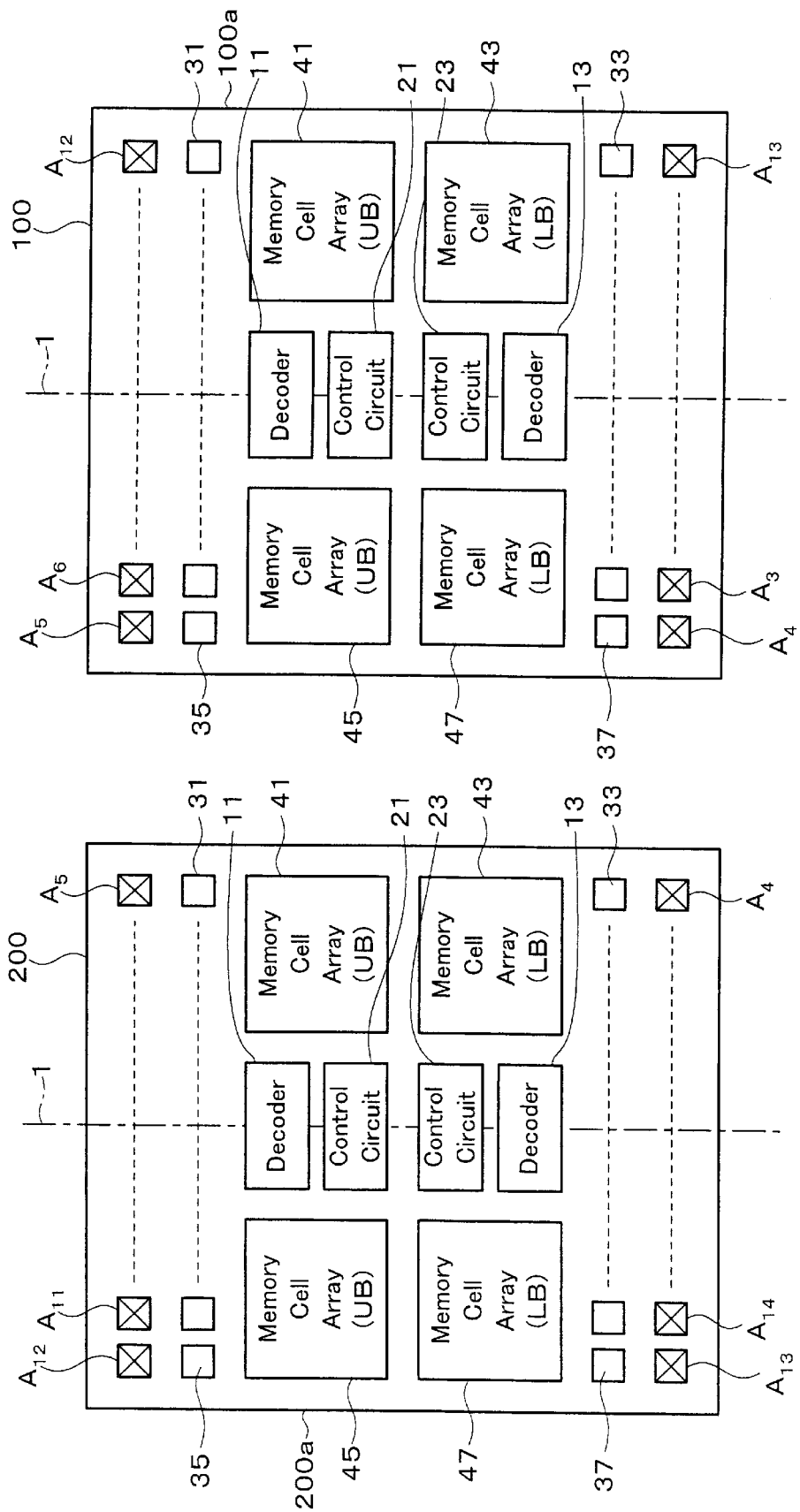
FIGS. 1A and 1B are diagrams for explaining first and second semiconductor chips according to the present embodiment.

Embodiments of the present invention overcome the problems and an objective is to provide a semiconductor chip and a semiconductor device which comprise two semiconductor chips having terminals arranged plane symmetrically while having a common structure, methods of fabricating thereof, a circuit board and an electronic device.

(1) A semiconductor device according to an embodiment of the present invention comprises:

a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits; and a second semiconductor chip comprising a plurality of second terminals, a plurality of second buffer circuits for at least one of inputting and outputting, a plurality of second interconnecting lines which electrically connect the plurality of second terminals to the plurality of second buffer circuits, and a second internal circuit electrically connected to the plurality of second buffer circuits, wherein positions of the plurality of first terminals and positions of the plurality of second terminals are in plane symmetry, wherein the first internal circuit is identical with the second internal circuit at least in design, and wherein at least a part of the plurality of first interconnecting lines and at least a part of the plurality of second interconnecting lines are formed in different patterns.

According to this embodiment of the present invention, although at least a part of the first and second interconnecting lines differs from each other, the first and second internal circuits are identical at least in design. Therefore, the first and second terminals are arranged plane symmetrically while having a common structure. Here, identical in design means that the difference lies within a range of error that occurs in the fabricating process.

(2) In the semiconductor device, the plurality of first and second terminals may be respectively arranged at peripheral portions of the first and second semiconductor chips.

(3) In the semiconductor device, the plurality of first terminals may be arranged symmetrically with respect to a line on the first semiconductor chip, and the plurality of second terminals may be arranged symmetrically with respect to a line on the second semiconductor chip.

(4) In the semiconductor device, a general structure of the plurality of first buffer circuits may be identical with a general structure of the plurality of second buffer circuits at least in design, excluding a circuit to which a chip select signal is input.

Here, identical in design means that the difference lies within a range of error that occurs in the fabricating process.

(5) In the semiconductor device, one terminal $T_1$ in the plurality of first terminals may correspond to two circuits $C_1$ and $C_2$ in the plurality of first buffer circuits, one terminal $T_2$ in the plurality of second terminals may correspond to two circuits $C_1$ and $C_2$ in the plurality of second buffer circuits, the two circuits $C_1$ and $C_2$ in the plurality of first buffer circuits may be identical with the two circuits $C_1$ and $C_2$ in the plurality of second buffer circuits at least in design, the terminals $T_1$ and $T_2$ may be located at a same position on the first and second semiconductor chips, the terminal $T_1$ may be selectively connected to the circuit $C_1$ by a part of the plurality of first interconnecting lines, and the terminal $T_2$ may be selectively connected to the circuit $C_2$ by a part of the plurality of second interconnecting lines.

Here, identical in design means that the difference lies within a range of error that occurs in the fabricating process.

(6) In the semiconductor device, a terminal $T_{1A}$ in the plurality of first terminals, which is positioned symmetrically to the terminal $T_1$ with respect to a line, may correspond to two circuits $C_{1A}$ and $C_{2A}$ in the plurality of first buffer circuits, a terminal $T_{2A}$ in the plurality of second terminals, which is positioned line symmetrical to the terminal $T_2$, may correspond to two circuits $C_{1A}$ and $C_{2A}$ in the plurality of second buffer circuits, the two circuits $C_{1A}$ and $C_{2A}$ in the plurality of first buffer circuits may be identical with the two circuits $C_{1A}$ and $C_{2A}$ in the plurality of second buffer circuits at least in design, the two circuits $C_{1A}$ and $C_{2A}$ may be identical with the two circuits $C_1$ and $C_2$ at least in design, the terminal $T_{1A}$ may be selectively connected to the circuit $C_{2A}$ by a part of the plurality of first interconnecting lines, and the terminal $T_{2A}$ may be selectively connected to the circuit $C_{1A}$ by a part of the plurality of second interconnecting lines.

Here, identical in design means that the difference lies within a range of error that occurs in the fabricating process.

(7) In the semiconductor device, each of first even number of terminals in the plurality of first terminals which corresponds to a plurality of signals for forming at least a part of one information may be connected to any one of the plurality of first buffer circuits and the first even number of terminals may be arranged symmetrically with respect to a line, and each of second even number of terminals in the plurality of second terminals which corresponds to a plurality of signals for forming at least a part of one information may be connected to any one of the plurality of second buffer circuits and the second even number of terminals may be arranged symmetrically with respect to a line.

(8) In the semiconductor device, each of the plurality of first terminals may be to any one of the plurality of first buffer circuits by a part of the plurality of first interconnecting lines, and each of the plurality of second terminals may be connected to any one of the plurality of second buffer circuits by a part of the plurality of second interconnecting lines.

(9) In the semiconductor device, two terminals $T_{A1}$ and $T_{B1}$ in the plurality of first terminals which are positioned symmetrically with respect to a line may correspond to two circuits $C_A$ and $C_B$ in the plurality of first buffer circuits which are positioned symmetrically with respect to a line, two terminals $T_{A2}$ and $T_{B2}$ in the plurality of second terminals which are positioned symmetrically with respect to a line may correspond to two circuits $C_A$ and $C_B$ in the plurality of second buffer circuits which are positioned symmetrically with respect to a line, the two circuits $C_A$ and $C_B$ in the plurality of first buffer circuits may be identical with the two circuits $C_A$ and $C_B$ in the plurality of second buffer circuits at least in design, the terminal $T_{A1}$ may be connected to the circuit $C_A$ and the terminal $T_{B1}$ is connected to the circuit $C_B$ and the terminal $T_{A2}$ may be connected to the circuit $C_b$ and the terminal $T_{B2}$ is connected to the circuit $C_A$.

Here, identical in design means that the difference lies within a range of error that occurs in the fabricating process.

(10) In the semiconductor device, even number of terminals in the plurality of first terminals which correspond to a plurality of signals for forming at least a part of one information may be arranged symmetrically with respect to a line, and even number of terminals in the plurality of second terminals which correspond to a plurality of signals for forming at least a part of one information may be arranged symmetrically with respect to a line.

(11) In the semiconductor device, the plurality of first buffer circuits may be arranged in a line at a central portion of the first semiconductor chip, and wherein the plurality of second buffer circuits may be arranged in a line at a central portion of the second semiconductor chip.

(12) In the semiconductor device, the plurality of first buffer circuits may be arranged along a center line of the first semiconductor chip, and the plurality of second buffer circuits may be arranged along a center line of the second semiconductor chip.

(13) In the semiconductor device, each of the first and second internal circuits may comprise a memory cell array.

(14) In the semiconductor device, the first and second semiconductor chips may be stacked, and two terminals in the plurality of first and second terminals which are located at a same position on the first and second semiconductor chips may be electrically connected.

(15) A semiconductor chip according to an embodiment of the present invention comprises:

a plurality of terminals;

a plurality of buffer circuits for at least one of inputting and outputting;

a plurality of interconnecting lines which electrically connect the plurality of terminals to the plurality of buffer circuits; and an internal circuit electrically connected to the plurality of buffer circuits, wherein one terminal $T_1$ in the plurality of terminals corresponds to two circuits $C_1$ and $C_2$ in the plurality of buffer circuits, and wherein the terminal $T_1$ is selectively connected to the circuit $C_1$ by a part of the plurality of interconnecting lines.

According to this embodiment of the present invention, the terminal $T_1$ and one of the two circuits $C_1$ and $C_2$ (circuit $C_1$) are selectively connected. Therefore, the terminal $T_1$ can be used for two kinds of purposes.

(16) In the semiconductor chip, another terminal $T_{1A}$ in the plurality of terminals which is positioned symmetrically with respect to a line to the terminal $T_1$ may correspond to two circuits $C_{1A}$ and $C_{2A}$ in the plurality of buffer circuits, the two circuits $C_{1A}$ and $C_{2A}$ may be identical with the two circuits $C_1$ and $C_2$ at least in design, and the terminal $T_{1A}$ may be selectively connected to the circuit $C_{2A}$ by a part of the plurality of interconnecting lines.

Here, identical in design means that the difference lies within a range of error that occurs in the fabricating process.

(17) In the semiconductor chip, each of even number of terminals in the plurality of terminals which corresponds to a plurality of signals for forming at least a part of one information may be connected to any one of the plurality of buffer circuits and the even number of terminals may be arranged symmetrically with respect to a line.

(18) A semiconductor chip according to an embodiment of the present invention comprises:
a plurality of terminals;
a plurality of buffer circuits for at least one of inputting and outputting;
a plurality of interconnecting lines which electrically connect the plurality of terminals to the plurality of buffer circuits; and
an internal circuit electrically connected to the plurality of buffer circuits,
wherein each of the plurality of terminals is connected to any one of the plurality of buffer circuits by a part of the plurality of interconnecting lines, and
wherein the plurality of buffer circuits are arranged in a line at a central portion of the semiconductor chip.

According to this embodiment of the present invention, a plurality of terminals can be easily connected to any buffer circuits.

(19) In the semiconductor chip, the plurality of buffer circuits may be arranged along a center line of the semiconductor chip.

(20) A semiconductor device according to an embodiment of the present invention comprises a plurality of stacked semiconductor chips,
wherein each of the semiconductor chips is the above described semiconductor chip.

(21) A semiconductor device according to an embodiment of the present invention comprises a plurality of stacked semiconductor chips,
wherein at least one of the semiconductor chips is the above-described semiconductor chip.

(22) A circuit board according to an embodiment of the present invention comprises the semiconductor device mounted thereon.

(23) An electronic device according to an embodiment of the present invention comprises the semiconductor device.

(24) A method of fabricating a semiconductor chip according to an embodiment of the present invention comprises forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits,
wherein one terminal $T_1$ in the plurality of terminals corresponds to two circuits $C_1$ and $C_2$ in the plurality of buffer circuits, and
wherein the terminal $T_1$ is selectively connected to the circuit $C_1$ by a part of the plurality of interconnecting lines.

According to this embodiment of the present invention, the terminal $T_1$ and one of the two circuits $C_1$ and $C_2$ are selectively connected. Therefore, the terminal $T_1$ can be used for two kinds of purposes.

(25) In the method of fabricating a semiconductor chip, another terminal $T_{1A}$ in the plurality of terminals which is positioned symmetrically to the terminal $T_1$ with respect to a line may correspond to two circuits $C_{1A}$ and $C_{2A}$ in the plurality of buffer circuits,
the two circuits $C_{1A}$ and $C_{2A}$ and the two circuits $C_1$ and $C_2$ may be formed identical at least in design, and
the terminal $T_{1A}$ may be selectively connected to the circuit $C_{2A}$ by a part of the plurality of interconnecting lines.

Here, identical in design means that the difference lies within a range of error that occurs in the fabricating process.

(26) In the method of fabricating a semiconductor chip, each of even number of terminals in the plurality of terminals which correspond to a plurality of signals for forming at least a part of one information may be connected to any one of the plurality of buffer circuits and the even number of terminals are arranged symmetrically with respect to a line.

(27) A method of fabricating a semiconductor chip according to an embodiment of the present invention comprises forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits,
wherein each of the plurality of terminals is connected to any one of the plurality of buffer circuits by a part of the plurality of interconnecting lines, and
wherein the plurality of buffer circuits are arranged in a line at a central portion of the semiconductor chip.

According to this embodiment of the present invention, a plurality of terminals can be easily connected to any buffer circuits.

(28) In the method of fabricating a semiconductor chip, the plurality of buffer circuits may be arranged along a center line of the semiconductor chip.

(29) A method of fabricating a semiconductor device according to an embodiment of the present invention comprises:
fabricating a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits, and
fabricating a second semiconductor chip comprising a plurality of second terminals, a plurality of second buffer circuits for at least one of inputting and outputting, second interconnecting lines which electrically connect the plurality of second terminals to the plurality of second buffer circuits, and a second internal circuit electrically connected to the plurality of second buffer circuits;
wherein the first and second internal circuits are formed at least with a same mask in design in such a way as to have a same structure in design;
wherein the plurality of first terminals and the plurality of second terminals are formed at least with a same mask in design in such a way as to be arranged symmetrically with respect to a line in a same arrangement in design; and
wherein at least a part of the plurality of first interconnecting lines and at least a part of the plurality of second interconnecting lines are formed with masks of different designs.

According to this embodiment of the present invention, as the first and second internal circuits (or the first and second terminals) are formed in the same process so as to have the same structure in design, the productivity is improved. Further, a plurality of the first terminals (a plurality of the second terminals) are formed so as to be arranged symmetrically with respect to a line. It is, therefore, possible to arrange the first and second terminals plane symmetrically, while they have the same arrangement. Here, identical in design means that the difference lies within a range of error that occurs in the fabricating process.

(30) In the method of fabricating a semiconductor device, the plurality of first buffer circuits and the plurality of second buffer circuits may be formed with a same mask at least in design in such a way as to have a same structure in design, excluding a circuit to which a chip select signal is input.

Here, identical in design means that the difference lies within a range of error that occurs in the fabricating process.

Preferred embodiments of the present invention will now be described with reference to the accompanying drawings.

First Embodiment

The following discusses a preferred embodiment of the present invention with reference to the drawings. The outline of the structure of a semiconductor device according to the embodiment is described first, then the detailed structure will be discussed. Then, modes that realize mirror chips will be described.

Outline of Structure of Semiconductor Device

Figure 4:
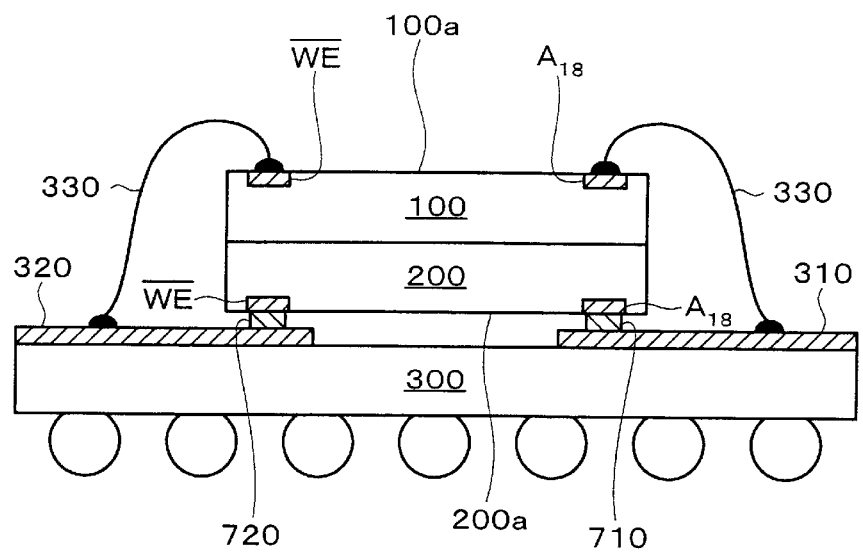
FIG. 4 is a diagram schematically showing the cross section of a semiconductor device according to the embodiment.

FIG. 4 is a diagram schematically showing the cross section of a semiconductor device according to the embodiment. The semiconductor device has a first semiconductor chip (e.g., static random access memory (SRAM) chip) 100 and a second semiconductor chip (e.g., SRAM chip) 200. The semiconductor device has a circuit board 300. The semiconductor device is used in, for example, a portable device, such as a portable telephone. For miniaturization and to increase the memory capacity, a plurality of memory chips (the first and second semiconductor chips 100 and 200 in the embodiment) may be arranged in a stacked manner in a portable device.

The first and second semiconductor chips 100 and 200 have the same chip size and both have a memory capacity of, for example, 8 megabits. Integrated circuits, such as memory cell arrays, are respectively formed on an active surface 100a of the first semiconductor chip 100 and an active surface 200a of the second semiconductor chip 200. Many first and second terminals (an address terminal $A_{18}$ and a write enable terminal WE(bar) in FIG. 4) which connect to the integrated circuits are formed at the peripheral portions of the active surfaces 100a and 200a. Note that the "(bar)" means active low. The terminals may be pads.

The first semiconductor chip 100 is arranged with the active surface 100a upwards in the diagram, and the second semiconductor chip 200 is arranged with the active surface 200a downwards in the diagram. The opposite side of the active surface 100a is adhered to the opposite side of the active surface 200a. This enables the first and second terminals of the first and second semiconductor chips 100 and 200 to be exposed even though the first and second semiconductor chips 100 and 200 are the same size.

The first semiconductor chip 100 and the second semiconductor chip 200 are electrically connected to the circuit board 300 by wire bonding and face-down bonding, respectively. Many interconnecting lines (an address signal line 310 and a write enable signal line 320 are shown in FIG. 4) are formed on the surface of the circuit board 300. The address terminal $A_{18}$ and the write enable terminal WE(bar) of the first semiconductor chip 100 are respectively connected to the address signal line 310 and the write enable signal line 320 by wires 330. The address terminal $A_{18}$ and the write enable terminal WE(bar) of the second semiconductor chip 200 are connected to the address signal line 310 and the write enable signal line 320 via gold balls 710 and 720, respectively.

In FIG. 4, the address terminal $A_{18}$ of the first semiconductor chip 100 is positioned near the address terminal $A_{18}$ of the second semiconductor chip 200, and the write enable terminal WE(bar) of the first semiconductor chip 100 is positioned near the write enable terminal WE(bar) of the second semiconductor chip 200. When semiconductor chips are arranged in such a stacked manner, if terminals having the same function (e.g., address) are positioned near each other, it is convenient for connection to an external portion (e.g., a circuit board).

To easily realize it with the structure wherein the opposite sides of the active surfaces are adhered as shown in FIG. 4, it is effective to make the first semiconductor chip 100 a mirror chip of the second semiconductor chip 200 (the second semiconductor chip 200 can be the to be a mirror chip of the first semiconductor chip 100). In some case, a mirror chip is the second semiconductor chip whose terminals having the same functions (terminals with the same functions in the embodiment) are arranged left-side right and/or upside down with respect to the first semiconductor chip.

Figure 5:
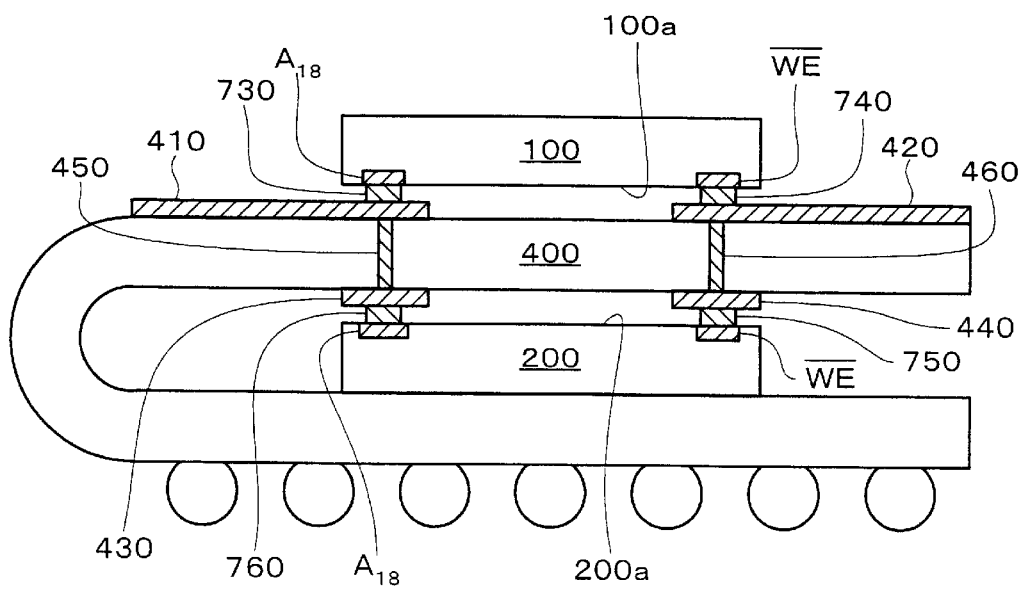
FIG. 5 is a diagram schematically showing the cross section of another example of a semiconductor device according to the embodiment.

The mirror chip is also used in a structure shown in FIG. 5. FIG. 5 is a diagram schematically showing the cross section of another example of a semiconductor device according to the embodiment. A circuit board 400 is disposed between the active surface 100a of the first semiconductor chip 100 and the active surface 200b of the second semiconductor chip 200. The first semiconductor chip 100 is bonded face down to one side of the circuit board 400. The second semiconductor chip 200 is bonded face down to the other side of the circuit board 400. Of plurality of first and second terminals, two terminals (e.g., the write enable terminal WE(bar), the address terminal $A_{18}$ or the like) which are located at the same positions on the first and second semiconductor chips 100 and 200 are electrically connected.

An address signal line 410 and a write enable signal line 420 are formed on one side of the circuit board 400. An address signal line 430 and a write enable signal line 440 are formed on the other side of the circuit board 400. The address signal line 410 and the address signal line 430 are connected by a connecting layer 450 that penetrates the circuit board 400. The write enable signal line 420 and the write enable signal line 440 are connected by a connecting layer 460 that penetrates the circuit board 400.

The address terminal $A_{18}$ and the write enable terminal WE(bar) of the first semiconductor chip 100 are connected to the address signal line 410 and the write enable signal line 420 via gold balls 730 and 740, respectively. The address terminal $A_{18}$ and the write enable terminal WE(bar) of the second semiconductor chip 200 are connected to the address signal line 430 and the write enable signal line 440 via gold balls 760 and 750, respectively.

Detailed Structure of Semiconductor Device Structures of First and Second Semiconductor Chips FIG. 1A is a plan view of the first semiconductor chip 100, and FIG. 1B is a plan view of the second semiconductor chip 200. The first semiconductor chip 100 and second semiconductor chip 200 both have a memory capacity of 8 megabits which is 512 k words×16 bits. The first semiconductor chip 100 and second semiconductor chip 200 have common internal circuits (excluding first and second buffer circuits), such as memory cell arrays, and common arrangements thereof, but differ in the arrangements of the first and second terminals.

The first semiconductor chip 100 has a decoder 11, a control circuit 21, a control circuit 23 and a decoder 13 in order from the top in the diagram as internal circuits excluding the first and second buffer circuits. They are positioned on a line 1 which is a line of symmetry. Note that the line 1 is an imaginary line and does not exist actually. First buffer circuits (input circuits•input/output circuits) 31 and 33, a memory cell array 41 and a memory cell array 43 are arranged in the right area of the line 1 of the first semiconductor chip 100 in order from the top in the diagram. First buffer circuits (input circuits•input/output circuits) 35 and 37, a memory cell array 45 and a memory cell array 47 are arranged in the left area of the line 1 of the first semiconductor chip 100 in order from the top in the diagram.

The first buffer circuits 31, 33, 35 and 37 are constituted by input cells or input/output cells which correspond to the respective terminals. SRAM memory cells of 2 megabits are formed in each of the memory cell arrays 41, 43, 45 and 47. The memory cell arrays 41 and 45 are upper bytes and the memory cell arrays 43 and 47 are lower bytes.

Internal circuits (indicated by functional blocks) are also arranged in the second semiconductor chip 200 shown in FIG. 1B. The internal circuits (excluding the first and second buffer circuits 31, 33, 35 and 37) of the first and second semiconductor chips 100 and 200 are identical in the structure and arrangement at least in design. Here, identical in design means that the difference lies within a range of error that occurs in the fabricating process. The same is true of the following description. The general structure of the first buffer circuits is identical with the general structure of the second buffer circuits at least in design, excluding the circuit to which a chip select signal is input.

The following discusses the first and second terminals of the first and second semiconductor chips 100 and 200. As shown in FIG. 1A, address terminals $A_5$, $A_6$, . . . , $A_{12}$ are arranged, in order from the left in the diagram, as first terminals at the upper edge portion of the active surface 100a of the first semiconductor chip 100 (see FIG. 2 for the details). Those terminals are 22 in quantity. The terminals are used for connection to an external portion. Further, address terminals $A_4$, $A_3$, . . . , $A_{13}$ are arranged, in order from the left in the diagram, as first terminals at the lower edge portion of the active surface 100a (see FIG. 3 for the details). Those terminals are 24 in quantity.

On the other hand, as the second semiconductor chip 200 shown in FIG. 1B is a mirror chip of the first semiconductor chip 100, the second terminals (pads) are arranged left-side right with respect to the first terminals (pads). That is, address terminals $A_{12}$, $A_{11}$, . . . , $A_5$ are arranged, in order from the left in the diagram, as second terminals, at the upper edge portion of the active surface 200a of the second semiconductor chip 200 (see FIG. 2 for the details). Those terminals are 22 in quantity. Further, address terminals $A_{13}$, $A_{14}$, . . . , $A_4$ are arranged, in order from the left in the diagram, as second terminals, at the lower edge portion of the active surface 200b (see FIG. 3 for the details). Those terminals are 24 in quantity.

Arrangement of First and Second Terminals

Figure 2:
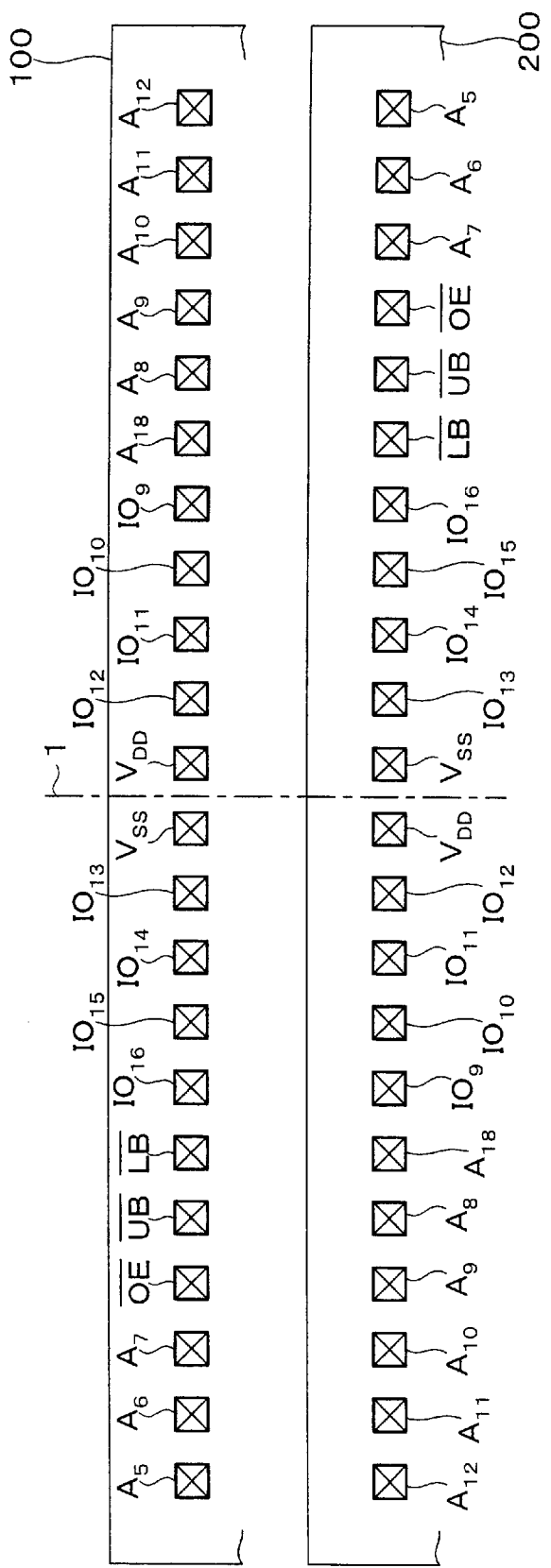
FIG. 2 is a diagram of first and second terminals in contrast with each other.
Figure 3:
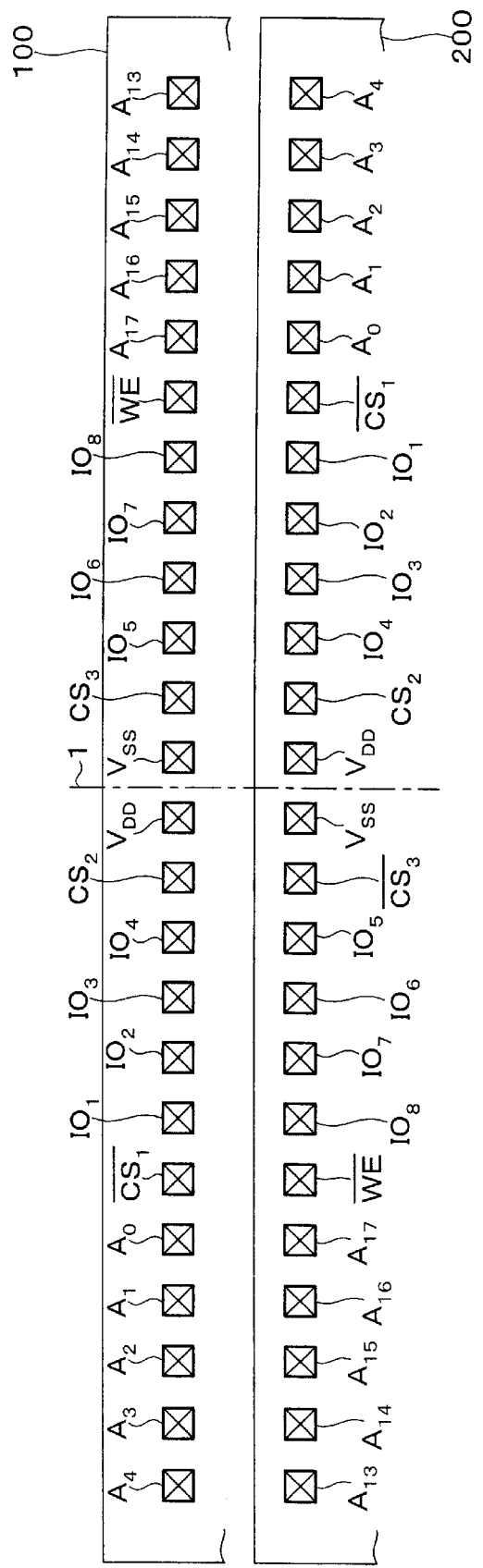
FIG. 3 is a diagram of first and second terminals in contrast with each other.

The arrangement of the terminals will be described using FIGS. 2 and 3. FIG. 2 is a plan view showing the first terminals arranged at the upper portion of the active surface 100a of the first semiconductor chip 100 and the second terminals arranged at the upper portion of the active surface 200a of the second semiconductor chip 200 in contrast with each other. FIG. 3 is a plan view showing the first terminals arranged at the lower portion of the active surface 100a of the first semiconductor chip 100 and the second terminals arranged at the lower portion of the active surface 200a of the second semiconductor chip 200 in contrast with each other. The positions of the first terminals and the positions of the second terminals are symmetric with respect to a plane. A plurality of first terminals are arranged symmetrically with respect to a line on the first semiconductor chip 100. A plurality of second terminals are arranged symmetrically with respect to a line on the second semiconductor chip 200.

As shown in FIG. 2, address terminals $A_5$, $A_6$ and $A_7$, an output enable terminal OE(bar), an upper byte terminal UB(bar), a lower byte terminal LB(bar), input/output terminals $IO_{16}$, $IO_{15}$, $IO_{14}$ and $IO_{13}$, power supply terminals $V_{SS}$ and $V_{DD}$, input/output terminals $IO_{12}$, $IO_{11}$, $IO_{10}$ and $IO_9$, and address terminals $A_{18}$, $A_8$, $A_9$, $A_{10}$, $A_{11}$ and $A_{12}$ are arranged in order from the left on the first semiconductor chip 100. On the other hand, the terminals of the second semiconductor chip 200 are arranged left-side right.

As shown in FIG. 3, address terminals $A_4$, $A_3$, $A_2$, $A_1$ and $A_0$, a chip select terminal $CS_1$, input/output terminals $IO_1$, $IO_2$, $IO_3$ and $IO_4$, chip select terminal $CS_2$, power supply terminals $V_{DD}$ and $V_{ss}$, chip select terminal $CS_3$, input/output terminals $IO_5$, $IO_6$, $IO_7$ and $IO_8$, a write enable terminal WE(bar) and address terminals $A_{17}$, $A_{16}$, $A_{15}$, $A_{14}$ and $A_{13}$ are arranged in order from the left on the first semiconductor chip 100. On the second semiconductor chip 200, the terminals (pads) are arranged left-side right, and a chip select terminal $CS_3$(bar) is arranged instead of the chip select terminal $CS_3$.

The individual terminals (pads) will now be discussed briefly. Address signals are input to the address terminals $A_0$ to $A_{18}$ shown in FIGS. 2 and 3.

A chip select signal which is a function of an ordinary SRAM is input to a chip select terminal $CS_1$(bar) and the chip select terminal $CS_2$ shown in FIG. 3. The chip select terminal $CS_3$ and chip select terminal $CS_3$(bar) are terminals (pads) specific to the embodiment to which the signal of an address $A_{19}$ is input from an external unit. As the logic of the chip select terminal $CS_3$ is opposite to the logic of the chip select terminal $CS_3$(bar), when the signal of the address $A_{19}$ is 0 (L), the second semiconductor chip 200 is selected and activated. When the signal of the address $A_{19}$ is 1 (H), the first semiconductor chip 100 is selected and activated. Accordingly, this embodiment functions as an SRAM of 1 megaword×16 bits.

Data signals are input and output to the input/output terminals $IO_1$ to $IO_{16}$ shown in FIGS. 2 and 3 from an external unit. The input/output terminals $IO_1$ to $IO_8$ are selected by a lower byte signal which is input to the lower byte terminal LB(bar) shown in FIG. 2, and the input/output terminals $IO_9$ to $IO_{16}$ are selected by an upper byte signal which is input to the lower byte terminal UB(bar).

An output enable signal is input to the output enable terminal OE(bar) shown in FIG. 2. Power supplies are connected to the power supply terminals $V_{SS}$ and $V_{DD}$. A write enable signal is input to the write enable terminal WE(bar) shown in FIG. 3.

Modes That Realize Mirror Chip

According to this embodiment, the positions of a plurality of first terminals and the positions of a plurality of second terminals are symmetric with respect to a plane, the first and second internal circuits (excluding the first and second buffer circuits) are identical at least in design, and at least a part of a plurality of first interconnecting lines and at least a part of a plurality of second interconnecting lines are formed in different patterns. Therefore, the fabrication of a mirror chip becomes easier as compared with a case of fabricating a mirror chip by changing all the patterns of the internal circuits and the interconnecting lines.

There are following three modes to realize it. The patterns of the interconnecting lines can be changed by changing a mask for the interconnecting lines and a mask for via holes.

First Mode

Figure 6A:
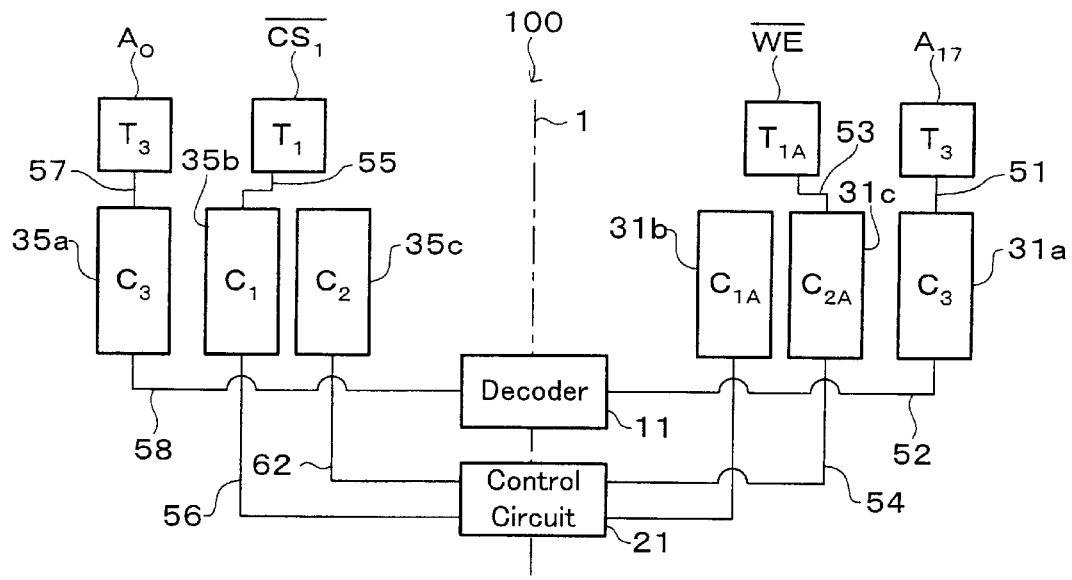
FIGS. 6A and 6B are explanatory diagrams of a first mode of the embodiment.
Figure 6B:
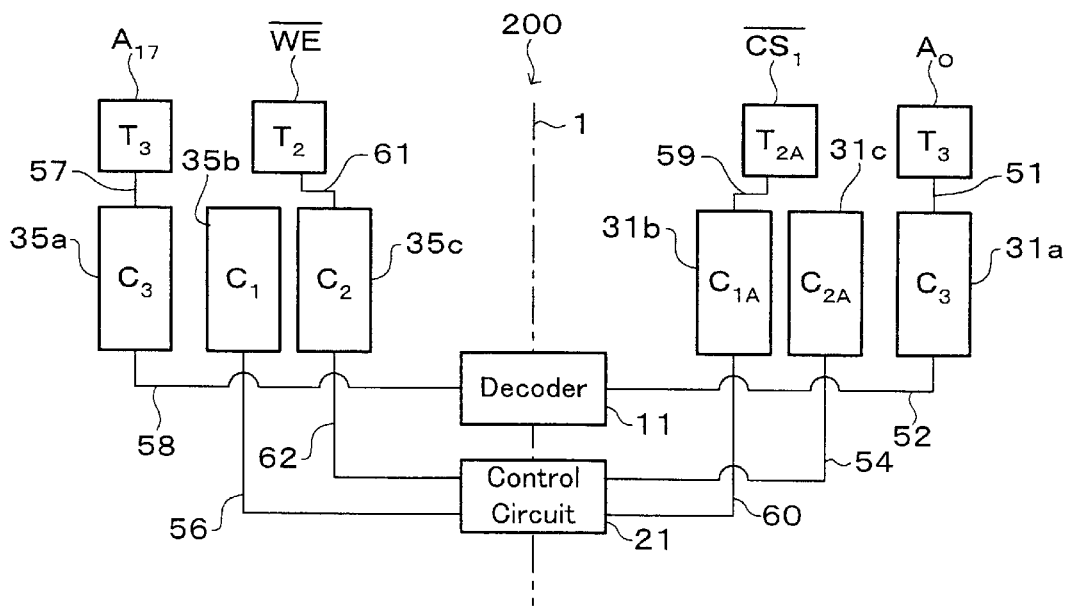

FIGS. 6A and 6B are explanatory diagrams of the first mode. The first or second internal circuits (decoder 11, control circuit 21, etc.) excluding the first or second buffer circuits are arranged, for example, on the line 1 which is a line of symmetry. First or second buffer circuits $C_3$, $C_{1A}$ and $C_{2A}$ (address input circuit 31a, $CS_1$(bar) input circuit 31b and WE(bar) input circuit 31c) are arranged in the right area of the line 1. Those input circuits are included in the input circuits•input/output circuits 31 shown in FIG. 1. First or second buffer circuits $C_3$, $C_1$ and $C_2$ (address input circuit 35a, $CS_1$(bar) input circuit 35b and WE(bar) input circuit 35c) are arranged in the left area of the line 1. Those input circuits are included in the input circuits•input/output circuits 35 shown in FIG. 1.

A terminal $T_1$ which is one of the plurality of first terminals of the first semiconductor chip 100 corresponds to two circuits $C_1$ and $C_2$ of the plurality of first buffer circuits. A terminal $T_2$ which is one of the plurality of second terminals of the second semiconductor chip 200 corresponds to two circuits $C_1$ and $C_2$ of the plurality of second buffer circuits. The two circuits $C_1$ and $C_2$ of the plurality of first buffer circuits are identical with the two circuits $C_1$ and $C_2$ of the plurality of second buffer circuits at least in design. In the first semiconductor chip 100 or second semiconductor chip 200, the terminals $T_1$ and $T_2$ are positioned at the same position. The terminal $T_1$ is selectively connected to the circuit $C_1$ by a part of the plurality of first interconnecting lines (interconnecting line 55). The terminal $T_2$ is selectively connected to the circuit $C_2$ by a part of the plurality of second interconnecting lines (interconnecting line 61).

A terminal $T_{1A}$ of the plurality of first terminals of the first semiconductor chip 100, which is positioned symmetrically to the terminal $T_1$ with respect to a line, corresponds to two circuits $C_{1A}$ and $C_{2A}$ of the plurality of first buffer circuits. A terminal $T_{2A}$ of the plurality of second terminals of the second semiconductor chip 200, which is positioned symmetrically to the terminal $T_2$ with respect to a line, corresponds to two circuits $C_{1A}$ and $C_{2A}$ of the plurality of second buffer circuits. The two circuits $C_{1A}$ and $C_{2A}$ of the plurality of first buffer circuits are identical with the two circuits $C_{1A}$ and $C_{2A}$ of the plurality of second buffer circuits at least in design. The two circuits $C_{1A}$ and $C_{2A}$ are identical with the two circuits $C_1$ and $C_2$ at least in design. Specifically, the circuits $C_{1A}$ and $C_1$ are identical in design, and the circuits $C_{2A}$ and $C_2$ are identical in design. The terminal $T_{1A}$ is selectively connected to the circuit $C_{2A}$ by a part of the plurality of first interconnecting lines (interconnecting line 53). The terminal $T_{2A}$ is selectively connected to the circuit $C_{1A}$ by a part of the plurality of second interconnecting lines (interconnecting line 59).

FIG. 6A is a partial plan view of the first semiconductor chip 100 with interconnecting lines and terminals (pads) formed on a bulk layer. An interconnecting line means an interconnect layer. The interconnecting lines and terminals are formed of metal, such as aluminum. The same is true of the interconnecting lines and terminals that will be mentioned below.

The address terminal $A_{17}$ is connected to the address input circuit 31a by an interconnecting line 51 and the address input circuit 31a is connected to the decoder 11 by an interconnecting line 52. The write enable terminal WE(bar) is connected to the WE(bar) input circuit 31c by an interconnecting line 53 and the WE(bar) input circuit 31c is connected to the control circuit 21 by an interconnecting line 54. The chip select terminal $CS_1$(bar) is connected to the $CS_1$(bar) input circuit 35b by an interconnecting line 55 and the $CS_1$(bar) input circuit 35b is connected to the control circuit 21 by an interconnecting line 56. The address terminal $A_0$ is connected to the address input circuit 35a by an interconnecting line 57 and the address input circuit 35a is connected to the decoder 11 by an interconnecting line 58. The $CS_1$(bar) input circuit 31b and the WE(bar) input circuit 35c are not used in the first semiconductor chip 100.

FIG. 6B is a partial plan view of the second semiconductor chip 200 with interconnecting lines and terminals formed on a bulk layer. Differences from FIG. 6A will be discussed. The address terminal $A_0$ is arranged at the position of the address terminal $A_{17}$ of FIG. 6A. The chip select terminal $CS_1$(bar) is arranged at the position of the write enable terminal WE(bar) of FIG. 6A. The chip select terminal $CS_1$(bar) is connected to the $CS_1$(bar) input circuit 31b by an interconnecting line 59 and the $CS_1$(bar) input circuit 31b is connected to the control circuit 21 by an interconnecting line 60. The write enable terminal WE(bar) is arranged at the position of the chip select terminal $CS_1$(bar) of FIG. 6A. The write enable terminal WE(bar) is connected to the WE(bar) input circuit 35c by an interconnecting line 61 and the WE(bar) input circuit 35c is connected to the control circuit 21 by an interconnecting line 62. The address terminal $A_{17}$ is arranged at the position of the address terminal $A_0$ of FIG. 6A. The WE(bar) input circuit 31c and the $CS_1$(bar) input circuit 35b are not used in the second semiconductor chip 200.

The terms used in the description of the advantages will be explained before describing the advantages of the first mode. A pair of terminals which have a line symmetrical relationship means terminals which are symmetric with respect to the line 1 as shown in FIGS. 2 and 3. With regard to the lower terminals of the first semiconductor chip 100, for example, it means a pair of the address terminals $A_4$ and $A_{13}$ or a pair of the chip select terminal $CS_1$(bar) and the write enable terminal WE(bar). Signals which have the same function mean, for example, the address signals or IO (input/output) signals. Signals which have different functions mean, for example, the chip select signal and the write enable signal, the output enable signal and address signal, the lower byte signal and address signal, or the upper byte signal and address signal.

The advantages of the first mode will be discussed. In the first mode, a single input circuit (buffer circuit) is provided with respect to each terminal of a pair of terminals (the address terminals $A_{17}$ and $A_0$ in FIG. 6, for example) to which signals having the same function are input (or input and output) among the pairs of terminals which have a line symmetrical relationship. This is because the same input circuit (buffer circuit) can be used for signals which have the same function. When signals have different functions, the same input circuit (buffer circuit) cannot be used. Accordingly, two input circuits (buffer circuits) are provided for each terminal of a pair of the terminals to which signals having different functions are input (the chip select terminal $CS_1$(bar) and write enable terminal WE(bar) in FIG. 6) and one of the circuits is selectively used. According to the first mode, each of the first semiconductor chip 100 and the second semiconductor chip 200 can have each terminal positioned near the input circuits (input/output circuits). Therefore, the first mode can make the signal delay smaller.

The pattern of interconnecting lines (interconnect layer) varies for the interconnecting lines 53, 55, 59 and 61 that connect to the terminals (e.g., the chip select terminal $CS_1$(bar) and write enable terminal WE(bar)) to which signals having different functions between the first semiconductor chip 100 and the second semiconductor chip 200 are input (or input and output). The pattern does not change for the interconnecting lines 51 and 57 connected to the terminals to which signals having the same function are input (or input and output). For example, the pattern of the interconnecting lines 51, 52, 57 and 58 of the second semiconductor chip 200 is the same as the pattern of the interconnecting lines 51, 52, 57 and 58 of the first semiconductor chip 100. Although not illustrated, for example, the pattern of the interconnecting lines that connect to the input/output terminals IO of the second semiconductor chip 200 is the same as the pattern of the interconnecting lines that connect to the input/output terminals IO of the first semiconductor chip 100. The same is true of the second and third modes that will be described later.

Second Mode

Figure 7A:
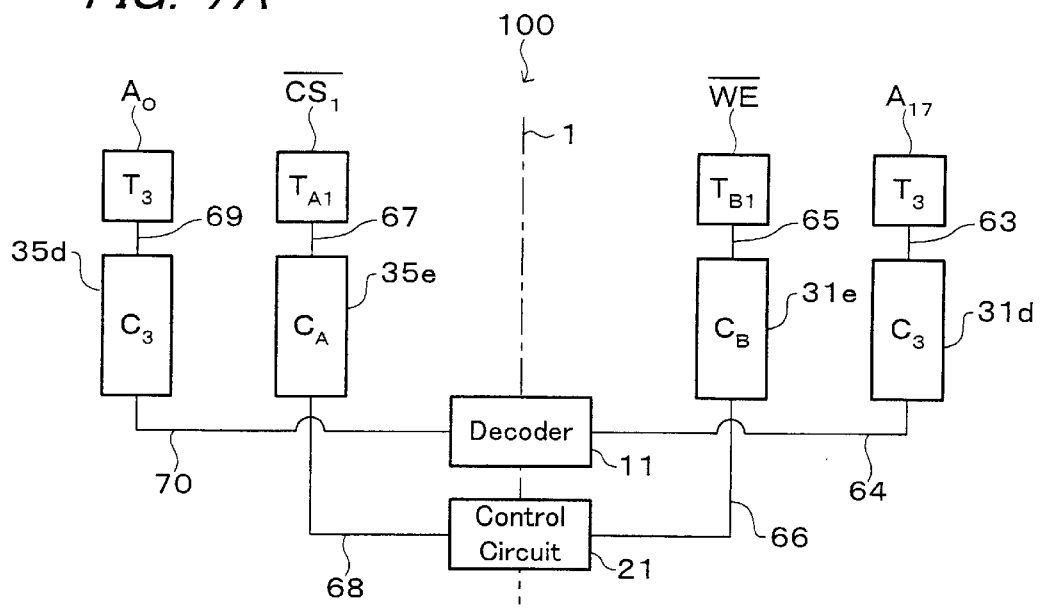
FIGS. 7A and 7B are explanatory diagrams of a second mode of the embodiment.
Figure 7B:
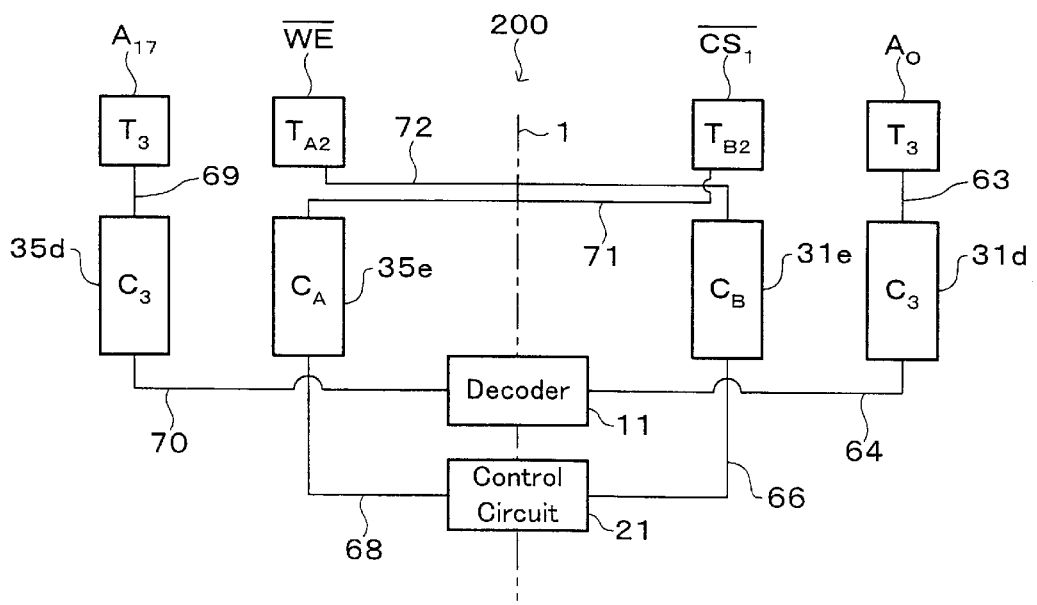

FIGS. 7A and 7B are explanatory diagrams of the second mode. The first or second internal circuits (decoder 11, control circuit 21, etc.) excluding the first or second buffer circuits are arranged on the line 1 which is a line of symmetry. First or second buffer circuits $C_3$ and $C_B$ (address input circuit 31d, WE(bar) input circuit 31e, etc.) are arranged in the right area of the line 1. Those input circuits are included in the input circuits•input/output circuits 31 shown in FIG. 1. First or second buffer circuits $C_3$ and $C_A$ (address input circuit 35d, $CS_1$(bar) input circuit 35e, etc.) are arranged in the left area of the line 1. Those input circuits are included in the input circuits•input/output circuits 35 shown in FIG. 1.

Two terminals $T_{A1}$ and $T_{B1}$ of the plurality of first terminals of the first semiconductor chip 100, which are positioned symmetrically with respect to a line, correspond to two circuits $C_A$ and $C_B$ of the plurality of first buffer circuits which are positioned symmetrically with respect to a line. Two terminals $T_{A2}$ and $T_{B2}$ of the plurality of second terminals of the second semiconductor chip 200, which are positioned symmetrically with respect to a line, correspond to two circuits $C_A$ and $C_B$ of the plurality of second buffer circuits which are positioned symmetrically with respect to a line. The two circuits $C_A$ and $C_B$ of the plurality of first buffer circuits are identical with the two circuits $C_A$ and $C_B$ of the plurality of second buffer circuits at least in design. The terminal $T_{A1}$ is connected to the circuit $C_A$ and the terminal $T_{B1}$ is connected to the circuit $C_B$. The terminal $T_{A2}$ is connected to the circuit $C_B$ and the terminal $T_{B2}$ is connected to the circuit $C_A$.

FIG. 7A is a partial plan view of the first semiconductor chip 100 with interconnecting lines and terminals formed on a bulk layer. The address terminal $A_{17}$ is connected to the address input circuit 31d by an interconnecting line 63 and the address input circuit 31d is connected to the decoder 11 by an interconnecting line 64. The write enable terminal WE(bar) is connected to the write enable terminal WE(bar) input circuit 31e by an interconnecting line 65 and the write enable terminal WE(bar) input circuit 31e is connected to the control circuit 21 by an interconnecting line 66. The chip select terminal $CS_1$(bar) is connected to the $CS_1$(bar) input circuit 35e by an interconnecting line 67 and the $CS_1$(bar) input circuit 35e is connected to the control circuit 21 by an interconnecting line 68. The address terminal $A_0$ is connected to the address input circuit 35d by an interconnecting line 69 and the address input circuit 35d is connected to the decoder 11 by an interconnecting line 70.

FIG. 7B is a partial plan view of the second semiconductor chip 200 with interconnecting lines and terminals (pads) formed on a bulk layer in FIG. 7A. Differences from FIG. 7A will be described. The address terminal $A_0$ is arranged at the position of the address terminal $A_{17}$ of FIG. 7A. The chip select terminal $CS_1$(bar) is arranged at the position of the write enable terminal WE(bar) of FIG. 7A. The chip select terminal $CS_1$(bar) is connected to the $CS_1$(bar) input circuit 35e by an interconnecting line 71. The write enable terminal WE(bar) is arranged at the position of the chip select terminal $CS_1$(bar) of FIG. 7A. The write enable terminal WE(bar) is connected to the write enable terminal WE(bar) input circuit 31e by an interconnecting line 72. The address terminal $A_{17}$ is arranged at the position of the address terminal $A_0$ of FIG. 7A.

Each of the plurality of first terminals is connected to one of the plurality of first buffer circuits by a part of the plurality of first interconnecting lines. Each of the plurality of second terminals is connected to one of the plurality of second buffer circuits by a part of the plurality of second interconnecting lines. Even number of terminals $T_3$ (e.g., the address terminals $A_0$ to $A_{18}$, $IO_{1\ to\ 16}$) of the plurality of first terminals which correspond to a plurality of signals for forming at least a part of one information (e.g., the address signal•input/output data signal) are arranged symmetrically with respect to a line. Even number of terminals $T_3$ (e.g., the address terminals $A_0$ to $A_{18}$, $IO_{1\ to\ 16}$) in the plurality of second terminals which correspond to a plurality of signals for forming at least a part of one information (e.g., the address signal•input/output data signal) are arranged symmetrically with respect to a line.

The advantages of the second mode will be described. According to the second mode, neither the first semiconductor chip 100 nor the second semiconductor chip 200 has unnecessary input circuits. Therefore, it is possible to effectively use an area of an SRAM chip. In the first semiconductor chip 100, each terminal (pads) can be positioned near the input circuits (input/output circuits). This enables to reduce the signal delay in the first semiconductor chip 100.

According to the second mode, the pattern of interconnecting lines which connect the input circuits•input/output circuits to the control circuit among the interconnecting lines connected to the terminals (e.g., the chip select terminal $CS_1$(bar) and write enable terminal WE(bar)) to which signals having different functions between the first semiconductor chip 100 and the second semiconductor chip 200 are input (or input and output) is the same (e.g., the interconnecting line 68 of the first semiconductor chip 100 and the interconnecting line 68 of the second semiconductor chip 200). This is because there is only one input circuit•input/output circuit which corresponds to each terminal. The same is true of the third mode that will be described below.

Third Mode

Figure 8A:
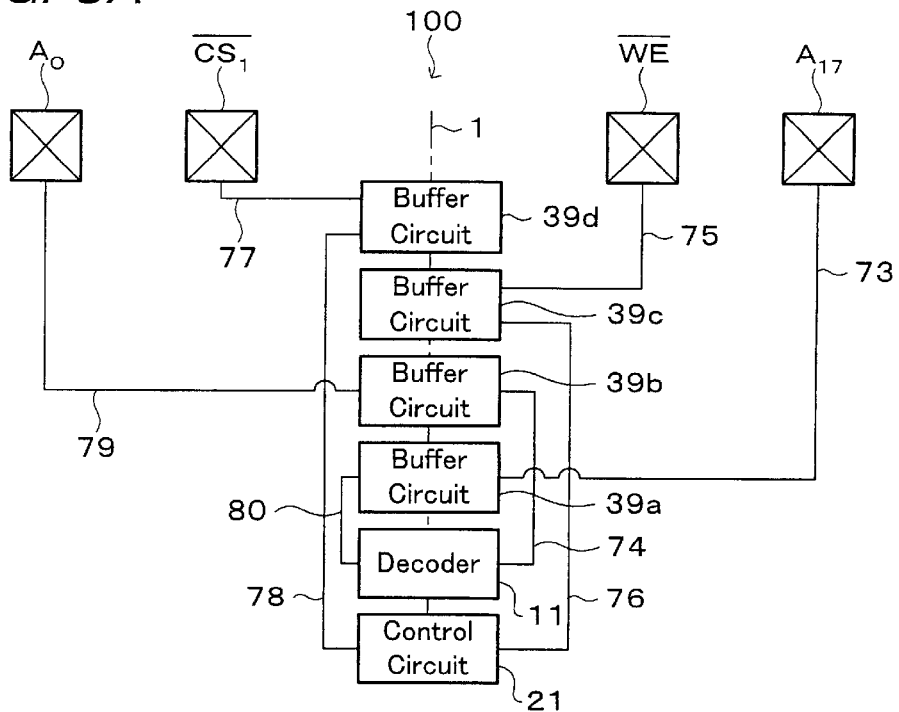
FIGS. 8A and 8B are explanatory diagrams of a third mode of the embodiment.
Figure 8B:
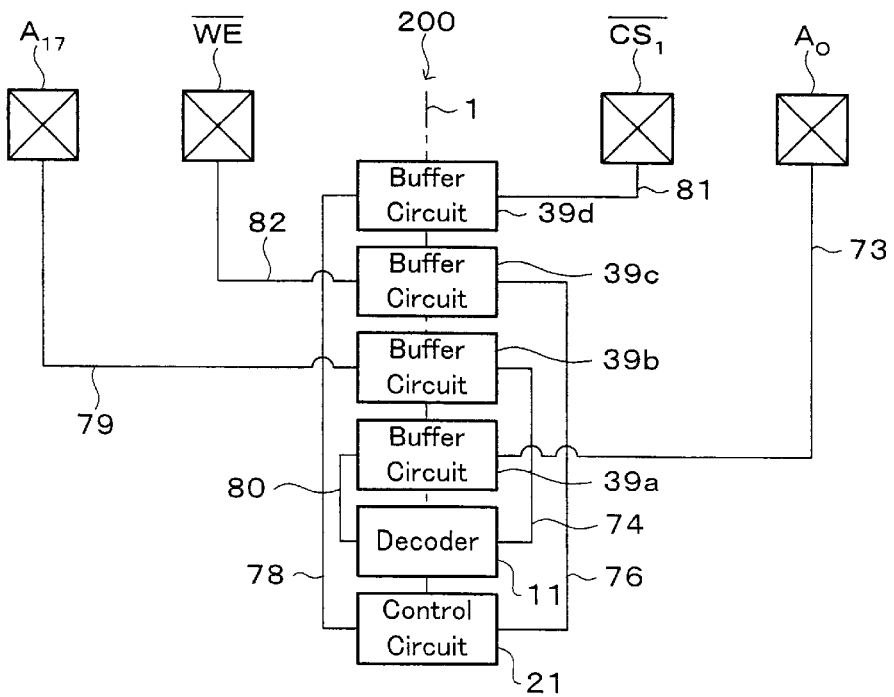

FIGS. 8A and 8B are explanatory diagrams of the third mode. The internal circuits (decoder 11, control circuit 21, etc.) excluding the first or second buffer circuits and the first and second buffer circuits (address input circuits 39a and 39b, write enable terminal WE(bar) input circuit 39c, $CS_1$(bar) input circuit 39d) are arranged on the line 1 which is a line of symmetry.

FIG. 8A is a partial plan view of the first semiconductor chip 100 with interconnecting lines and terminals (pads) formed on a bulk layer. The address terminal $A_{17}$ is connected to the address input circuit 39a as a buffer circuit by an interconnecting line 73. The address input circuit 39a as a buffer circuit is connected to the decoder 11 by an interconnecting line 80. The write enable terminal WE(bar) is connected to the write enable terminal WE(bar) input circuit 39c as a buffer circuit by an interconnecting line 75. The write enable terminal WE(bar) input circuit 39c as a buffer circuit is connected to the control circuit 21 by an interconnecting line 76. The chip select terminal $CS_1$(bar) as a buffer circuit is connected to the $CS_1$(bar) input circuit 39*d* as a buffer circuit by an interconnecting line 77. The $CS_1$(bar) input circuit 39*d* as a buffer circuit is connected to the control circuit 21 by an interconnecting line 78. The address terminal $A_0$ is connected to the address input circuit 39*b* as a buffer circuit by an interconnecting line 79. The address input circuit 39*b* as a buffer circuit is connected to the decoder 11 by an interconnecting line 74.

FIG. 8B is a partial plan view of the second semiconductor chip 200 with interconnecting lines and terminals (pads) formed on a bulk layer of FIG. 8A. Differences from FIG. 8A will be described. The address terminal $A_0$ is arranged at the position of the address terminal $A_{17}$ of FIG. 8A. The chip select terminal $CS_1$(bar) is arranged at the position of the write enable terminal WE(bar) of FIG. 8A. The chip select terminal $CS_1$(bar) is connected to the $CS_1$(bar) input circuit 39*d* as a buffer circuit by an interconnecting line 81. The write enable terminal WE(bar) is arranged at the position of the chip select terminal $CS_1$(bar) of FIG. 8A. The write enable terminal WE(bar) is connected to the write enable terminal WE(bar) input circuit 39*c* as a buffer circuit by an interconnecting line 82. The address terminal $A_{17}$ is arranged at the position of the address terminal $A_0$ of FIG. 8A.

According to this embodiment, the plurality of first buffer circuits are arranged in a line at the central portion of the first semiconductor chip 100 (e.g., along the center line) and the plurality of second buffer circuits are arranged in a line at the central portion of the second semiconductor chip 200 (e.g., along the center line).

The advantages of the third mode will be described. According to the third mode, neither the first semiconductor chip 100 nor the second semiconductor chip 200 has unnecessary input circuits. It is therefore possible to effectively use an area of an SRAM chip. Further, the distances between the terminals which have a line symmetry relationship and an input circuit•input/output circuit can be set approximately the same.

A method of fabricating a semiconductor chip or a semiconductor device according to an embodiment of the present invention includes steps necessary to fabricate the above described first or second semiconductor chip 100 or 200. The first and second semiconductor chips 100 and 200 and the first and second internal circuits can be fabricated in the same processes in such a way that they have the same structures in design. The first and second buffer circuits may be fabricated in the same process in such a way as to have the same structure in design. Note that a circuit, to which the chip select signal is input, of the first and second buffer circuits may be fabricated in such a way as to have a different structure.

Figure 9:
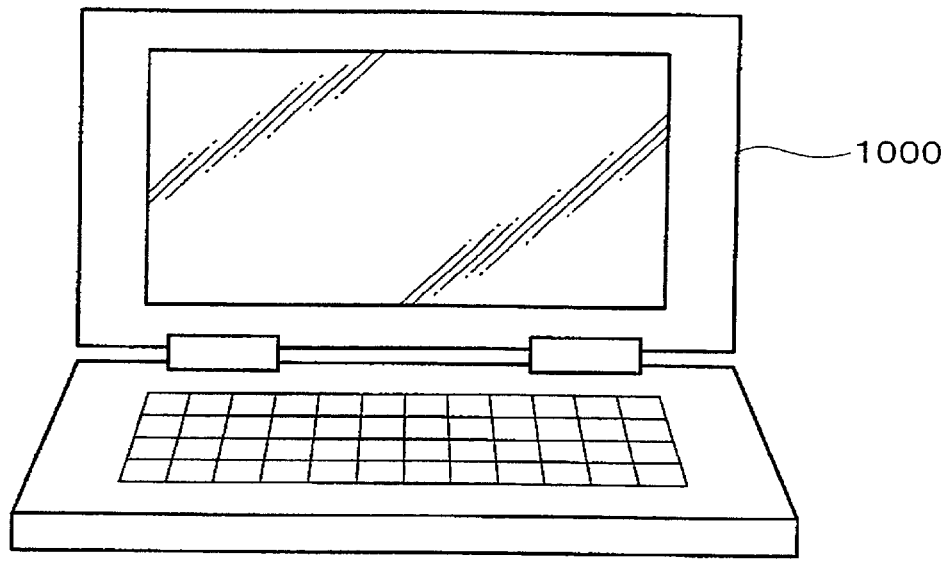
FIG. 9 is a diagram showing an electronic device according to an embodiment of the present invention.
Figure 10:
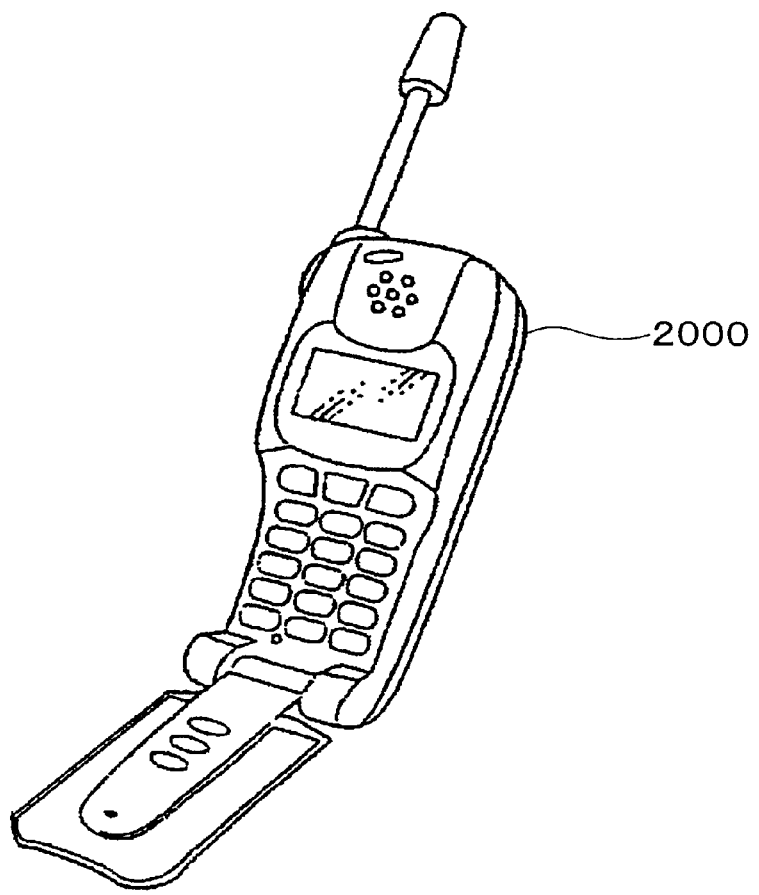
FIG. 10 is a diagram showing an electronic device according to an embodiment of the present invention.

FIG. 9 shows a notebook type personal computer 1000, and FIG. 10 shows a portable telephone 2000, as an electronic device according to an embodiment of the present invention.

Embodiments of the Present Invention as Seen from Other Aspects

A semiconductor device according to an embodiment of the present invention comprises:

a first semiconductor chip and a second semiconductor chip which becomes a mirror chip with respect to the first semiconductor chip, wherein each of the first semiconductor chip and the second semiconductor chip comprises a bulk layer on an active surface and an interconnect layer positioned on the bulk layer, wherein the bulk layer of the first semiconductor chip and the bulk layer of the second semiconductor chip have a common pattern, wherein the second semiconductor chip is made into a mirror chip by making the pattern of the interconnect layer of the second semiconductor chip different from the pattern of the interconnect layer of the first semiconductor chip.

According to this embodiment of the present invention, the second semiconductor chip which becomes a mirror chip and the first semiconductor chip have a common pattern for the bulk layers and have different patterns for the interconnect layers. It is therefore easier to produce a mirror chip as compared with a case where a mirror chip is produced by changing the patterns of the bulk layers and the patterns of the interconnect layers. According to the present invention, once a plurality of master wafers, on which up to bulk layers are formed, are prepared, it is possible to fabricate the first semiconductor chip using one master wafer and fabricate the second semiconductor chip using another master wafer. This enables to shorten the time necessary to fabricate the second semiconductor chip that becomes a mirror chip.

Each of the first semiconductor chip and the second semiconductor chip may comprise, on the active surface:

one terminals to connect to the interconnect layer, and other terminals which connect to the interconnect layer and to which signals with different functions from the signals to the one terminals are input, and wherein the one terminals and the other terminals may have a line symmetrical relationship on the active surface.

Each of the first semiconductor chip and the second semiconductor chip may comprise, on the active surface:

a plurality of IO terminals, wherein the IO terminals may have a line symmetry relationship on the active surface, and wherein the pattern of the interconnect layer that connects to the IO terminals in the first semiconductor chip may be identical with the pattern of the interconnect layer that connects to the IO terminals in the second semiconductor chip.

According to this mode, the IO terminals have a line symmetrical relationship on the active surface. As signals which have the same function are input to and output from those terminals, the pattern of the interconnect layer that connects to the IO terminals of the second semiconductor chip which is a mirror chip can be made identical with the pattern of the interconnect layer that connects to the IO terminals of the first semiconductor chip. The pattern of the interconnect layer that connects to the IO terminals means the pattern of the interconnect layer that connects the IO terminals to the input/output circuits for IO.

Each of the first semiconductor chip and the second semiconductor chip may comprise, on the active surface:

a plurality of other address terminals, wherein the other address terminals may have a line symmetrical relationship on the active surface, and wherein the pattern of the interconnect layer that connects to the other address terminals in the first semiconductor chip may be identical with the pattern of the interconnect layer that connects to the other address terminals in the second semiconductor chip.

According to this mode, the other address terminals have a line symmetrical relationship on the active surface. As signals which have the same function are input to and output from those terminals, the pattern of the interconnect layer that connects to the other address terminals of the second semiconductor chip can be made identical with the pattern of the interconnect layer that connects to the other address terminals of the first semiconductor chip. The pattern of the interconnect layer that connects to the other address terminals means the pattern of the interconnect layer that connects the other address terminals to the input circuits for the other address terminals.

Each of the first semiconductor chip and the second semiconductor chip may comprise, on the active surface, two sets of combinations including an input circuit for the one terminals and an input circuit for the other terminals, wherein one of the sets and the other set may be positioned symmetrically with respect to a line, wherein in the first semiconductor chip, the input circuit for the one terminals may be used in the one of the sets, and the input circuit for the other terminals may be used in the other set, and wherein in the second semiconductor chip, the input circuit for the other terminals may be used in the one of the sets, and the input circuit for the one terminals may be used in the other set.

According to this mode, one terminals can be arranged close to the input circuit for one terminals and other terminals can be arranged close to the input circuit for other terminals in each of the first and second semiconductor chips. It is therefore possible to reduce a signal delay between the terminals and input circuits.

Each of the first semiconductor chip and the second semiconductor chip may comprise, on the active surface, one set of input circuits for the one terminals and input circuits for the other terminals, wherein in the first semiconductor chip, the distances between the one terminals and the input circuits for the one terminals and the distances between the other terminals and the input circuits for the other terminals may be relatively short, and wherein in the second semiconductor chip, the distances between the one terminals and the input circuits for the one terminals and the distances between the other terminals and the input circuits for the other terminals may be relatively long.

According to this mode, neither the first semiconductor chip nor the second semiconductor chip has unnecessary input circuits. It is therefore possible to effectively use areas of the first semiconductor chip and the second semiconductor chip. According to this mode, as the distances from one terminals (or other terminals) to the input circuits for one terminals (or input circuits for other terminals) in the first semiconductor chip are relatively short, a signal delay between the terminals and input circuits in the first semiconductor chip can be made smaller.

Each of the one semiconductor chip and the other semiconductor chip may comprise, on the active surface, one set of input circuits for the one terminals and input circuits for the other terminals, and wherein the set may be positioned on a line that is a line of symmetry.

According to this mode, neither the first semiconductor chip nor the second semiconductor chip has unnecessary input circuits. It is therefore possible to effectively use areas of the first semiconductor chip and the second semiconductor chip. According to this mode, the distances between one terminals (or other terminals) and the input circuits for one terminals (or input circuits for other terminals) in the first semiconductor chip and the distances between one terminals (or other terminals) and the input circuits for one terminals (or input circuits for other terminals) in the second semiconductor chip can be made approximately the same.

Each of the first semiconductor chip and the second semiconductor chip may comprise a semiconductor memory.

The first semiconductor chip and the second semiconductor chip may have the same memory capacity, wherein the first semiconductor chip may comprise chip select terminals, wherein the second semiconductor chip may comprise chip select (bar) terminals, and wherein the chip select terminals of the first semiconductor chip and the chip select (bar) terminals of the second semiconductor chip may be positioned mirror symmetrically.

According to this mode, in case where the first semiconductor chip and the second semiconductor chip have a memory capacity of 8 Mbits, for example, a 16-Mbit semiconductor device can be yielded.

The first semiconductor chip may have the same chip size as the second semiconductor chip.

The opposite side of the active surface of the first semiconductor chip is arranged on the opposite side of the active surface of the second semiconductor chip. This has the following mode. Wire bonding may be carried out on the active surface of the first semiconductor chip and face-down bonding may be carried out on the active surface of the second semiconductor chip.

The active surface of the first semiconductor chip may face one side of a circuit board, and the active surface of the second semiconductor chip may face the other side of the circuit board.

Face-down bonding may be carried out on the active surface of the first semiconductor chip and on the active surface of the second semiconductor chip.

The present invention is not limited to the above-described embodiments, and may be modified in various forms.

For example, the present invention includes structures which are substantially the same as the structures that have been explained in the description of the embodiments (e.g., the structures that are the same in functions, methods and results, or the structures that are the same in object and results). The present invention includes structures wherein portions not essential in the structures that have been explained in the description of the embodiments are replaced. The present invention includes structures which demonstrate the same operational advantages as that of the structures explained in the description of the embodiments, or structures which can achieve the same object as that of the structures explained in the description of the embodiments. The present invention includes structures in which prior arts are added to the structures that have been explained in the description of the embodiments.

What is claimed is:

1. A semiconductor device comprising:
    a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits; and
    a second semiconductor chip comprising a plurality of second terminals, a plurality of second buffer circuits for at least one of inputting and outputting, a plurality of second interconnecting lines which electrically connect the plurality of second terminals to the plurality of second buffer circuits, and a second internal circuit electrically connected to the plurality of second buffer circuits,
    wherein positions of the plurality of first terminals and positions of the plurality of second terminals are symmetric with respect to a plane, wherein the first internal circuit is identical with the second internal circuit at least in design, and wherein at least a part of the plurality of first interconnecting lines and at least a part of the plurality of second interconnecting lines are formed in different patterns.

2. The semiconductor device as defined in claim 1, wherein the plurality of first and second terminals are respectively arranged at peripheral portions of the first and second semiconductor chips.

3. The semiconductor device as defined in claim 1, wherein the plurality of first terminals are arranged symmetrically with respect to a line on the first semiconductor chip, and wherein the plurality of second terminals are arranged symmetrically with respect to a line on the second semiconductor chip.

4. The semiconductor device as defined in claim 1, wherein a general structure of the plurality of first buffer circuits is identical with a general structure of the plurality of second buffer circuits at least in design, excluding a circuit to which a chip select signal is input.

5. The semiconductor device as defined in claim 1, wherein one terminal $T_1$ of the plurality of first terminals corresponds to two circuits $C_1$ and $C_2$ of the plurality of first buffer circuits, wherein one terminal $T_2$ of the plurality of second terminals corresponds to two circuits $C_1$ and $C_2$ of the plurality of second buffer circuits, wherein the two circuits $C_1$ and $C_2$ of the plurality of first buffer circuits are identical with the two circuits $C_1$ and $C_2$ of the plurality of second buffer circuits at least in design, wherein the terminals $T_1$ and $T_2$ are located at a same position on the first and second semiconductor chips, wherein the terminal $T_1$ is selectively connected to the circuit $C_1$ by a part of the plurality of first interconnecting lines, and wherein the terminal $T_2$ is selectively connected to the circuit $C_2$ by a part of the plurality of second interconnecting lines.

6. The semiconductor device as defined in claim 5, wherein a terminal $T_{1A}$ of the plurality of first terminals, which is positioned symmetrically to the terminal $T_1$ with respect to a line, corresponds to two circuits $C_{1A}$ and $C_{2A}$ of the plurality of first buffer circuits, wherein a terminal $T_{2A}$ of the plurality of second terminals, which is positioned symmetrically to the terminal $T_2$ with respect to a line, corresponds to two circuits $C_{1A}$ and $C_{2A}$ of the plurality of second buffer circuits, wherein the two circuits $C_{1A}$ and $C_{2A}$ of the plurality of first buffer circuits are identical with the two circuits $C_{1A}$ and $C_{2A}$ of the plurality of second buffer circuits at least in design, wherein the two circuits $C_{1A}$ and $C_{2A}$ are identical with the two circuits $C_1$ and $C_2$ at least in design, wherein the terminal $T_{1A}$ is selectively connected to the circuit $C_{2A}$ by a part of the plurality of first interconnecting lines, and wherein the terminal $T_{2A}$ is selectively connected to the circuit $C_{1A}$ by a part of the plurality of second interconnecting lines.

7. The semiconductor device as defined in claim 5, wherein each of first even number of terminals of the plurality of first terminals which corresponds to a plurality of signals for forming at least a part of one information is connected to any one of the plurality of first buffer circuits and the first even number of terminals are arranged symmetrically with respect to a line, and wherein each of second even number of terminals of the plurality of second terminals which corresponds to a plurality of signals for forming at least a part of one information is connected to any one of the plurality of second buffer circuits and the second even number of terminals are arranged symmetrically with respect to a line.

8. The semiconductor device as defined in claim 1, wherein each of the plurality of first terminals is connected to any one of the plurality of first buffer circuits by a part of the plurality of first interconnecting lines, and wherein each of the plurality of second terminals is connected to any one of the plurality of second buffer circuits by a part of the plurality of second interconnecting lines.

9. The semiconductor device as defined in claim 8, wherein two terminals $T_{A1}$ and $T_{B1}$ of the plurality of first terminals which are positioned symmetrically with respect to a line correspond to two circuits $C_A$ and $C_B$ of the plurality of first buffer circuits which are positioned symmetrically with respect to a line, wherein two terminals $T_{A2}$ and $T_{B2}$ of the plurality of second terminals which are positioned symmetrically with respect to a line correspond to two circuits $C_A$ and $C_B$ of the plurality of second buffer circuits which are positioned symmetrically with respect to a line, wherein the two circuits $C_A$ and $C_B$ of the plurality of first buffer circuits are identical with the two circuits $C_A$ and $C_B$ of the plurality of second buffer circuits at least in design, wherein the terminal $T_{A1}$ is connected to the circuit $C_A$ and the terminal $T_{B1}$ is connected to the circuit $C_B$, and wherein the terminal $T_{A2}$ is connected to the circuit $C_B$ and the terminal $T_{B2}$ is connected to the circuit $C_A$.

10. The semiconductor device as defined in claim 8, wherein even number of terminals of the plurality of first terminals which correspond to a plurality of signals for forming at least a part of one information are arranged symmetrically with respect to a line, and wherein even number of terminals of the plurality of second terminals which correspond to a plurality of signals for forming at least a part of one information are arranged symmetrically with respect to a line.

11. The semiconductor device as defined in claim 8, wherein the plurality of first buffer circuits are arranged in a line at a central portion of the first semiconductor chip, and wherein the plurality of second buffer circuits are arranged in a line at a central portion of the second semiconductor chip.

12. The semiconductor device as defined in claim 11, wherein the plurality of first buffer circuits are arranged along a center line of the first semiconductor chip, and wherein the plurality of second buffer circuits are arranged along a center line of the second semiconductor chip.

13. The semiconductor device as defined in claim 1,
wherein each of the first and second internal circuits comprises a memory cell array.

14. The semiconductor device as defined in claim 1,
wherein the first and second semiconductor chips are stacked, and
wherein two terminals of the plurality of first and second terminals which are located at a same position on the first and second semiconductor chips are electrically connected.

15. A semiconductor chip comprising:
a plurality of terminals;
a plurality of buffer circuits for at least one of inputting and outputting;
a plurality of interconnecting lines which electrically connect the plurality of terminals to the plurality of buffer circuits; and
an internal circuit electrically connected to the plurality of buffer circuits,
wherein one terminal $T_1$ of the plurality of terminals corresponds to two circuits $C_1$ and $C_2$ of the plurality of buffer circuits, and
wherein the terminal $T_1$ is selectively connected to the circuit $C_1$ by a part of the plurality of interconnecting lines.

16. The semiconductor chip as defined in claim 15,
wherein another terminal $T_{1A}$ of the plurality of terminals which is positioned symmetrically to the terminal $T_1$ with respect to a line corresponds to two circuits $C_{1A}$ and $C_{2A}$ of the plurality of buffer circuits,
wherein the two circuits $C_{1A}$ and $C_{2A}$ are identical with the two circuits $C_1$ and $C_2$ at least in design, and
wherein the terminal $T_{1A}$ is selectively connected to the circuit $C_{2A}$ by a part of the plurality of interconnecting lines.

17. The semiconductor chip as defined in claim 15,
wherein each of even number of terminals of the plurality of terminals which corresponds to a plurality of signals for forming at least a part of one information is connected to any one of the plurality of buffer circuits and the even number of terminals are arranged symmetrically with respect to a line.

18. A semiconductor chip comprising:
a plurality of terminals;
a plurality of buffer circuits for at least one of inputting and outputting;
a plurality of interconnecting lines which electrically connect the plurality of terminals to the plurality of buffer circuits; and
an internal circuit electrically connected to the plurality of buffer circuits,
wherein each of the plurality of terminals is connected to any one of the plurality of buffer circuits by a part of the plurality of interconnecting lines, and
wherein the plurality of buffer circuits are arranged in a line at a central portion of the semiconductor chip.

19. The semiconductor chip as defined in claim 18,
wherein the plurality of buffer circuits are arranged along a center line of the semiconductor chip.

20. A semiconductor device comprising a plurality of stacked semiconductor chips,
wherein each of the semiconductor chips is the semiconductor chip as defined in claim 15.

21. A semiconductor device comprising a plurality of stacked semiconductor chips,
wherein at least one of the semiconductor chips is the semiconductor chip as defined in claim 15.

22. A circuit board on which the semiconductor device as defined in claim 1 is mounted.

23. An electronic device comprising the semiconductor device as defined in claim 1.

24. A method of fabricating a semiconductor chip which comprises:
forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits,
wherein one terminal $T_1$ of the plurality of terminals corresponds to two circuits $C_1$ and $C_2$ of the plurality of buffer circuits, and
wherein the terminal $T_1$ is selectively connected to the circuit $C_1$ by a part of the plurality of interconnecting lines.

25. The method of fabricating a semiconductor chip as defined in claim 24,
wherein another terminal $T_{1A}$ of the plurality of terminals which is positioned symmetrically to the terminal $T_1$ with respect to a line corresponds to two circuits $C_{1A}$ and $C_{2A}$ of the plurality of buffer circuits,
wherein the two circuits $C_{1A}$ and $C_{2A}$ and the two circuits $C_1$ and $C_2$ are formed identical at least in design, and
wherein the terminal $T_{1A}$ is selectively connected to the circuit $C_{2A}$ by a part of the plurality of interconnecting lines.

26. The method of fabricating a semiconductor chip as defined in claim 24,
wherein each of even number of terminals of the plurality of terminals which correspond to a plurality of signals for forming at least a part of one information is connected to any one of the plurality of buffer circuits and the even number of terminals are arranged symmetrically with respect to a line.

27. A method of fabricating a semiconductor chip which comprises:
forming a plurality of terminals, a plurality of buffer circuits for at least one of inputting and outputting, a plurality of interconnecting lines which electrically connect the plurality of terminals to the plurality of buffer circuits, and an internal circuit electrically connected to the plurality of buffer circuits,
wherein each of the plurality of terminals is connected to any one of the plurality of buffer circuits by a part of the plurality of interconnecting lines, and
wherein the plurality of buffer circuits are arranged in a line at a central portion of the semiconductor chip.

28. The method of fabricating a semiconductor chip as defined in claim 27,
wherein the plurality of buffer circuits are arranged along a center line of the semiconductor chip.

29. A method of fabricating a semiconductor device which comprises:
fabricating a first semiconductor chip comprising a plurality of first terminals, a plurality of first buffer circuits for at least one of inputting and outputting, a plurality of first interconnecting lines which electrically connect the plurality of first terminals to the plurality of first buffer circuits, and a first internal circuit electrically connected to the plurality of first buffer circuits, and fabricating a second semiconductor chip comprising a plurality of second terminals, a plurality of second buffer circuits for at least one of inputting and outputting, second interconnecting lines which electrically connect the plurality of second terminals to the plurality of second buffer circuits, and a second internal circuit electrically connected to the plurality of second buffer circuits;

wherein the first and second internal circuits are formed at least with a same mask in design in such a way as to have a same structure in design;

wherein the plurality of first terminals and the plurality of second terminals are formed at least with a same mask in design in such a way as to be arranged symmetrically with respect to a line in a same arrangement in design; and wherein at least a part of the plurality of first interconnecting lines and at least a part of the plurality of second interconnecting lines are formed with masks of different designs.

30. The method of fabricating a semiconductor device as defined in claim 29, wherein the plurality of first buffer circuits and the plurality of second buffer circuits are formed with a same mask at least in design in such a way as to have a same structure in design, excluding a circuit to which a chip select signal is input.

* * * * *